United States Patent
Volk, Jr.

[19]

[11] Patent Number: 6,166,317
[45] Date of Patent: *Dec. 26, 2000

[54] CRYOGENIC THERMOELECTRIC GENERATOR

[76] Inventor: Joseph A. Volk, Jr., 380 Hackmann La., St. Louis, Mo. 63141

[*] Notice: This patent issued on a continued prosecution application filed under 37 CFR 1.53(d), and is subject to the twenty year patent term provisions of 35 U.S.C. 154(a)(2).

[21] Appl. No.: 09/252,458

[22] Filed: Feb. 18, 1999

[51] Int. Cl.$^7$ .................................................. H01L 37/00
[52] U.S. Cl. ................................. 136/201; 136/205
[58] Field of Search .............................. 136/200, 201, 136/205, 206, 210, 218, 224, 239, 242, 203; 62/3.2, 3.3

[56] References Cited

U.S. PATENT DOCUMENTS

| | | | |
|---|---|---|---|
| 3,081,361 | 3/1963 | Henderson et al. | 136/4 |
| 3,434,203 | 3/1969 | Thorp | 29/573 |
| 3,496,026 | 2/1970 | Mayo | 136/202 |
| 3,524,772 | 8/1970 | Purdy | 136/205 |
| 3,593,110 | 7/1971 | Huebener | 136/207 |
| 3,977,909 | 8/1976 | Cremonese | 136/206 |
| 4,459,428 | 7/1984 | Chou | 136/211 |
| 4,497,973 | 2/1985 | Heath et al. | 136/212 |
| 4,513,167 | 4/1985 | Brandstetter | 136/244 |
| 4,687,879 | 8/1987 | Hendricks | 136/212 |
| 4,711,971 | 12/1987 | Duncan et al. | 136/211 |
| 5,089,054 | 2/1992 | Sievers | 136/202 |
| 5,288,336 | 2/1994 | Strachan et al. | 136/200 |
| 5,554,819 | 9/1996 | Baghai-Kermani | 136/206 |

OTHER PUBLICATIONS

Thermal Insulation, Chemical Engineer's Handbook, Perry & Chilton, 5th Edition, 1973, pp. 11–48 to 11–50.

*Primary Examiner*—Kathryn Gorgos
*Assistant Examiner*—Thomas H. Parsons
*Attorney, Agent, or Firm*—Senniger, Powers, Leavitt & Roedel

[57] ABSTRACT

A cryogenic thermoelectric generator preferably includes a thermoelectric transducer and a cold source (i.e., anything having a below-ambient temperature) thermally coupled to the "cold side" of the transducer. The cold source preferably includes a vessel adapted for containing a cryogen (i.e., a substance having a temperature no greater than 0° C.). The vessel is operatively connected to the cold side of the thermoelectric transducer for thermally coupling a cryogen contained by the vessel to said cold side of the thermoelectric transducer, thereby inducing a temperature differential across the hot and cold sides of the thermoelectric transducer when the vessel contains a cryogen. The thermoelectric transducer produces electric power in response to the temperature differential. The thermoelectric transducer is preferably a semiconductor device, the cryogen is preferably a substantially pure liquid such as liquid nitrogen or liquid hydrogen, and the vessel is preferably a Dewar vessel.

41 Claims, 5 Drawing Sheets

CRYOGENIC THERMOELECTRIC GENERATOR

The present invention relates to thermoelectric power generators and, more particularly, to thermally coupling cryogenic substances to thermoelectric devices for producing temperature differentials thereacross, thereby producing electric power.

BACKGROUND OF THE INVENTION

A variety of thermoelectric transducers are known in the art for converting electric current into thermal energy, and vice versa. In general, when an electric current passes through such a transducer, a temperature differential is produced across opposite sides or portions thereof. This phenomenon is known as the Peltier effect. Conversely, when two sides or portions of a thermoelectric transducer have different temperatures, the transducer produces an electric current. This opposite or reverse phenomenon is known as the Seebeck effect. Thus, a thermoelectric transducer can be used to produce thermal cooling (or heating) or electric current.

In practice, thermoelectric transducers are frequently used to provide cooling for heat-sensitive devices or systems. For example, the "cold side" of Peltier transducers (typically semiconductor devices implemented in integrated circuit packages) are commonly connected to other types of electronics and computer devices, and are driven with electric current to produce cooling and thereby reduce operating temperatures. In the opposite direction, thermoelectric devices have long been used to sense temperature differences in various systems. For example, a thermoelectric thermocouple is commonly employed in the control system for traditional natural gas equipment to sense the heat produced by a pilot light, and to provide a current signal indicative thereof. In this manner, the control system can ensure the pilot light is present and burning before natural gas is released.

On a much more limited basis, thermoelectric transducers have also been used as thermoelectric power generators for producing usable electric power from heat. For example, thermocouple thermopiles—often constructed of cascaded bimetallic thermocouples—have been used to convert heat collected from the sun into electric power (this should be distinguished from converting solar light energy into electric power using photovoltaic devices or "solar cells"). However, the thermopiles cannot produce electric power at times when heat from the sun cannot be collected, such as at night and during adverse weather conditions. Accordingly, the electric power produced by these thermopiles must be stored, such as in batteries, in order to be available at times when electric power cannot be so produced on demand. Thermopiles have also been used to convert heat produced by radioactive isotopes ("radioisotopes") into electric power, but this approach has not been commercially implemented, presumably due to the impractical nature of using radioisotopes and related environmental and health issues.

Apparently because of the high temperatures generally required by known thermoelectric power generators to produce desired amounts of electric power—typically on the order of several hundred or even several thousand degrees Fahrenheit—and because semiconductor devices are generally unsuitable for such high temperature applications, the advantages and additional options provided by semiconductor technology have not been exploited in the field of thermoelectric power generation.

SUMMARY OF THE INVENTION

The inventor hereof has significantly advanced the art of thermoelectric power generation by recognizing the availability, suitability and desirability of using cold (e.g., below 0° C.), rather than hot (e.g., above-ambient) substances (including materials) as the primary means for inducing temperature differentials across thermoelectric transducers, thereby producing electric power. More specifically, the inventor has determined that cryogens (i.e., substances having temperatures of 0° C. or less) are especially suited for this purpose, and has identified a number of specific cryogens, including a number of substantially pure liquids such as liquid nitrogen, that are readily available, that are relatively safe to use, and that can be utilized with thermoelectric transducers to produce electric power on demand. Additionally, due to the suitability of semiconductor devices for low temperature applications, semiconductor-based thermoelectric transducers can be advantageously used, and can be fabricated and implemented in virtually any configuration required for a particular application. Perhaps most importantly, the cryogens and thermoelectric transducers contemplated by the present invention are readily transportable and can therefore be used to produce electric power wherever they may be located. Thus, in accordance with the teachings of the present invention, a cryogenic thermoelectric generator can be designed to produce electric power, on demand, for virtually any application, including remote and mobile applications (including electric vehicles).

In accordance with one aspect of the present invention, a cryogenic thermoelectric generator comprises a thermoelectric transducer having a cold side and a hot side, and a cold source thermally coupled with the cold side, where the cold source induces a temperature differential between the cold and hot sides of the thermoelectric transducer when the hot side is at a temperature of at least ambient, the thermoelectric transducer producing electric power in response to the temperature differential.

In accordance with another aspect of the present invention, a device for generating electric power comprises at least one thermoelectric transducer having a hot side and cold side, and a vessel adapted for containing a cryogen. The vessel is operatively connected to the thermoelectric transducer for thermally coupling a cryogen contained by the vessel to the cold side, thereby inducing a temperature differential across the hot and cold sides of the thermoelectric transducer when the vessel contains the cryogen, the thermoelectric transducer producing electric power in response to the temperature differential. The thermoelectric transducer is preferably a semiconductor or superconductor device, and preferably comprises bismuth telluride. The transducer preferably comprises a plurality of stacked thermoelectric modules that are thermally connected in series, and electrically connected in parallel, for inducing a temperature differential across each individual module that is generally within the range of that module's ideal operating temperature. However, the transducer may also or instead comprise a plurality of thermoelectric modules that are arranged in any series and/or parallel arrangement so as to yield a desired output voltage, current and/or impedance. The device may also comprise a dispenser for controlling the amount of cryogen that is thermally coupled to the transducer. The cryogen can be brought into direct contact with the transducer, or can be thermally coupled to the transducer through an intermediate medium. A heat source can also be provided for delivering heat to either or both sides of the thermoelectric transducer, as needed.

In accordance with another aspect of the present invention, a cryogenic thermoelectric system comprises at least one thermoelectric transducer having a hot side and a cold side, and a cold source thermally coupled to the cold side of the transducer for inducing a temperature differential between the hot and cold sides. The system also includes an electrical device, such as an electric motor, that is powered by the electric current produced by the thermoelectric transducer in response to the temperature differential. The heat that is produced by the electrical device, as a result of being powered by the electric current, is preferably fed back to the hot side of the thermoelectric transducer for maintaining the temperature differential thereacross. The cold source preferably comprises a cryogen selected from the group consisting of liquid nitrogen, liquid oxygen, liquid argon, liquid hydrogen, liquid helium, liquid krypton, liquid methane, and dry ice. The cryogen can also be thermally coupled to the hot side of the transducer in a controlled fashion so that, between the heat from the heat source and the cooling ability of the cryogen, the temperature of the transducer's hot side can be increased or decreased on demand, as desired. Likewise, the heat from the heat source can be provided to the transducer's cold side for the same purpose.

In accordance with still another aspect of the present invention, a method for producing electric power with a thermoelectric transducer comprises the step of creating a temperature differential across the thermoelectric transducer by inducing a below-ambient temperature at a cold side of the thermoelectric transducer. Preferably, the first side of the transducer is maintained at a temperature below approximately 200° K, and heat is applied to the hot side of the thermoelectric device for maintaining the temperature differential thereacross. The cryogen can be brought into direct contact with the thermoelectric device, or with an intermediate medium that is thermally coupled to the thermoelectric device, and the amount of cryogen brought into contact with the thermoelectric device (or the intermediate medium) can be controlled. In this manner, the temperature differential across the thermoelectric device can be controlled to control the amount of electric power produced.

While the principal advantages and features of the invention have been described above, a greater understanding of the invention may be attained by referring to the drawings and the detailed description of the preferred embodiments provided below.

DETAILED DESCRIPTION OF THE PREFERRED EMBODIMENTS

Figure 1:
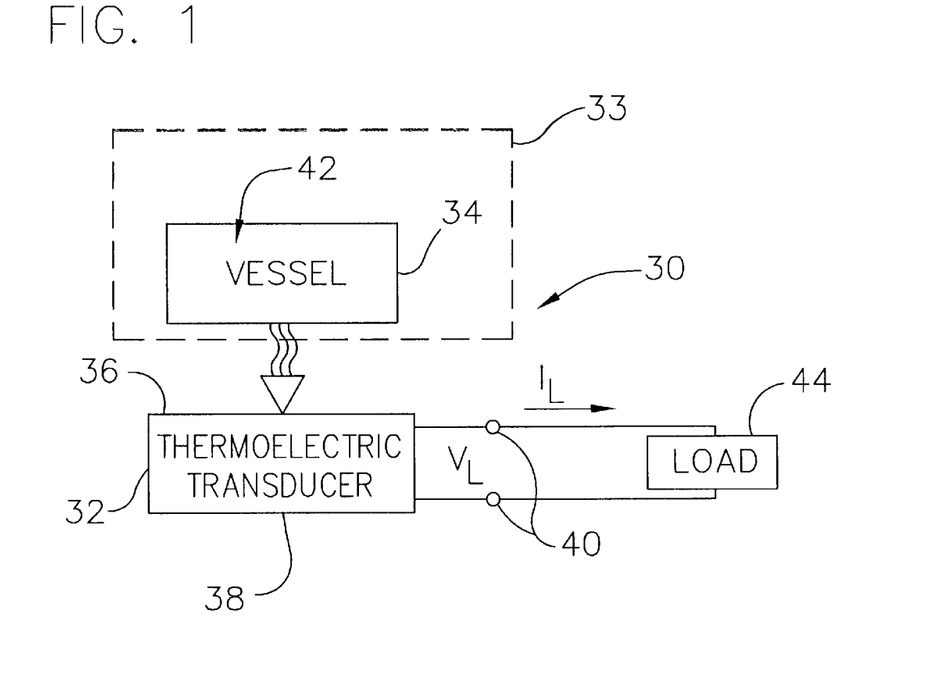
FIG. 1 is block diagram of a cryogenic thermoelectric generator according to the present invention.

A preferred embodiment of a cryogenic thermoelectric generator according to the present invention is designated generally by the reference character 30 in FIG. 1, and is known as the Volk Generator. The generator 30 includes a thermoelectric transducer 32 (which may itself comprise multiple thermoelectric modules) and a cold source 33 for cooling one side of the thermoelectric transducer to a below-ambient temperature. As used herein, the phrase "cold source" refers to anything having a temperature less than ambient. In this first preferred embodiment, the cold source 33 comprises a vessel 34 for containing a cryogen. As used herein, the term "cryogen" refers to any substance (including material) having a temperature of or below 0° C. Thus, the vessel 34 is adapted for containing one or more types of freezing substances. The thermoelectric transducer 32 has a "cold side" 36 and a "hot side" 38, and is intended to operate with the cold side 36 at a temperature less than that of the hot side 38. The thermoelectric transducer also comprises a pair of output terminals 40. The vessel 34 is connected to the transducer 32 in such a manner as to thermally couple a cryogen 42 contained by the vessel 34 to the transducer's cold side 36. When this occurs, a temperature differential is induced across the transducer's hot and cold sides 36, 38 and, in response to this temperature differential, the transducer 32 produces an output current $I_L$ and an output voltage $V_L$ usable for energizing a load circuit 44 connected across the output terminals 40, as shown in FIG. 1. The load circuit 44 may comprise any type of electrical device or system, and may even comprise one or more batteries for storing the electrical power produced by the generator 30. As an example, the load circuit may comprise an inverter for converting a dc output of the generator 30 into an ac output suitable for energizing an ac load circuit.

The cryogen 42 is preferably a substance that is both portable and safe to use, and that can readily induce a temperature differential across the transducer 32. In this preferred embodiment, the cryogen 42 is a substantially pure liquid having a temperature well below 0° C., and is preferably liquid nitrogen, liquid oxygen, liquid argon, liquid hydrogen, liquid helium, liquid krypton or liquid methane, where the temperature range of these liquids, when contained, is between approximately 4 and 200° K (i.e., between approximately −269 and −73° C.). In the inventor's most preferred embodiment, the cryogen 42 is liquid nitrogen, and the vessel 34 is a Dewar vessel. However, a wide variety of other "cryogens" suitable for use in the present invention are readily apparent to those skilled in the art including, for example, solidified carbon dioxide ("dry ice"), liquid natural gas, and even freezing water or ice.

The thermoelectric transducer is preferably a silicon-based semiconductor device comprising bismuth and telluride. Semiconductor-based devices are well suited for low temperature applications, and can be specially designed and fabricated for a wide variety of applications. Such devices can also exhibit superconductive properties at low temperatures, and may thus provide additional advantages. However, other types of thermoelectric transducers can also be used without departing from the scope of the present invention, including, for example, bimetallic thermocouples and thermocouple thermopiles.

Figure 2:
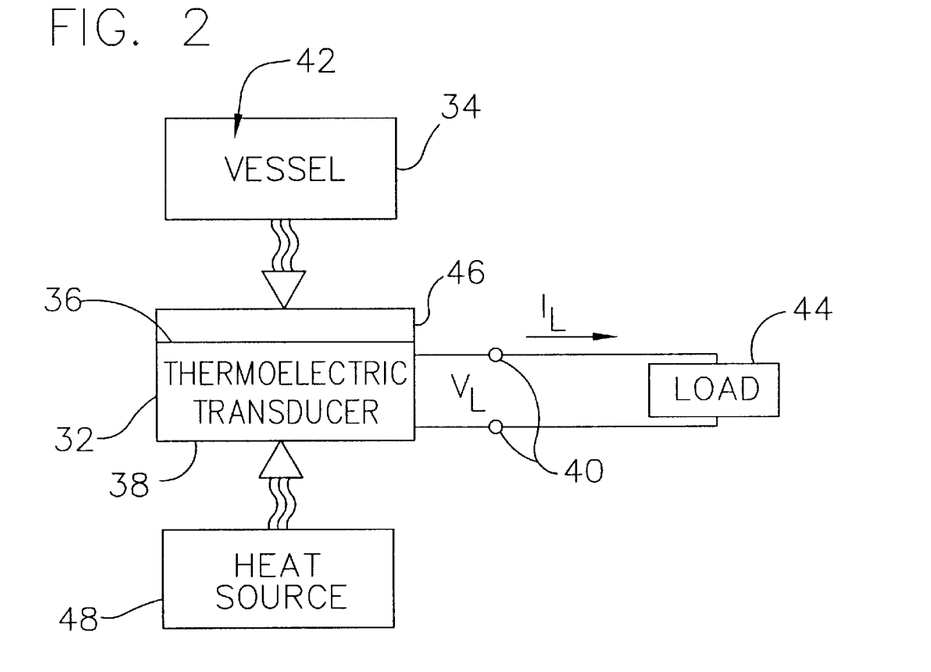
FIG. 2 is a block diagram of the generator shown in FIG. 1 with an intermediate medium positioned between the thermoelectric transducer and the cryogen vessel, and with an optional heat source.

In the system shown in FIG. 1, the cryogen 42 is thermally coupled directly to the cold side 36 of the transducer 32. Where direct contact between the cryogen and the transducer is not desired, the cryogen can be, instead, thermally coupled to the cold side through an intermediate medium 46, as shown in FIG. 2. While a variety of thermally conductive materials can be used for the intermediate medium 46, the intermediate medium 46 may also comprise thermally non-conductive or semiconductive materials.

Also shown in FIG. 2 is a heat source 48 that is thermally coupled to the hot side 38 when necessary or desirable to obtain or maintain a temperature differential across the transducer 32 sufficient for producing a desired amount of electric current. By applying heat to the hot side 38 via the heat source 48, the temperature differential between the hot and cold sides 36, 38 of the transducer 32 can be controlled and adjusted as needed. This is in contrast to simply exposing the hot side 38 to ambient temperatures, as shown in FIG. 1. The heat source may also be necessary, in certain applications, to prevent the cryogen, which is delivered to the cold side 36, from reducing or "pulling down" the temperature of the hot side 38 to an unacceptable level, and can be used to maintain the hot side at a higher temperature (but possibly still a temperature of 0° C. or less) than the cold side. In one preferred application, as the cryogen contained by the vessel "boils off" (i.e., changes to a gaseous state), the cryogen gas is burned and the resulting heat is used as the heat source 48, which may also comprise a heat exchanger for regulating the amount of heat provided to the hot side 38. Note that for the purpose of producing this heat, the cryogen gas can be burned to drive a motor for producing mechanical energy. In this application, liquid hydrogen is preferably used as the cryogen, and the motor is a hydrogen-burning motor that is thermally coupled to the hot side 38 of the thermoelectric transducer 32, possibly via a heat exchanger.

Figure 3:
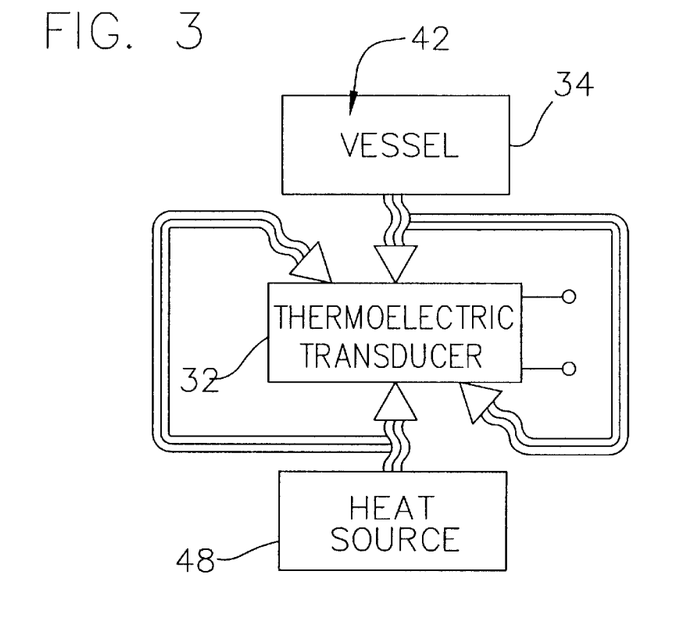
FIG. 3 is a block diagram illustrating an embodiment where the cryogen and the heat source are thermally coupled to multiple sides of the thermoelectric transducer.

To more precisely control the temperatures of the transducer's cold and hot sides 36, 38, and thus the temperature differential across the transducer, heat from the heat source 48 can be selectively applied to both the cold side 36 and the hot side 38 of the transducer 32 (although not necessarily at the same time), as can the cryogen 42. Such an arrangement is illustrated in FIG. 3. In one preferred application, the heat source is the flu gases emitted by a boiler system, such as an electric power-producing boiler system. For example, the hot side of the thermoelectric transducer can be thermally coupled to the exhaust pipe of such a boiler system for maintaining or producing a desired temperature differential across the thermoelectric transducer, thus producing electric power in addition to that produced by the boiler system. Alternatively, multiple heat sources and/or cold sources can be used, where at least one heat source and/or cold source is provided for each of the hot and cold sides. In a preferred implementation of this arrangement, the heat source has multiple controlled outputs that are connected to the cold and hot sides 36, 38 of the thermoelectric transducer 32 for providing heat thereto in a controlled manner. The cryogen 42 can be thermally coupled to the hot side 38 by, for example, delivering some of the cryogen 42 to the hot side for direct contact therewith, or for contact with an intermediate medium that is thermally coupled to the hot side. By controlling the temperature differential across the thermoelectric transducer, a constant current or voltage output (or other desired output) can be obtained.

Figure 4:
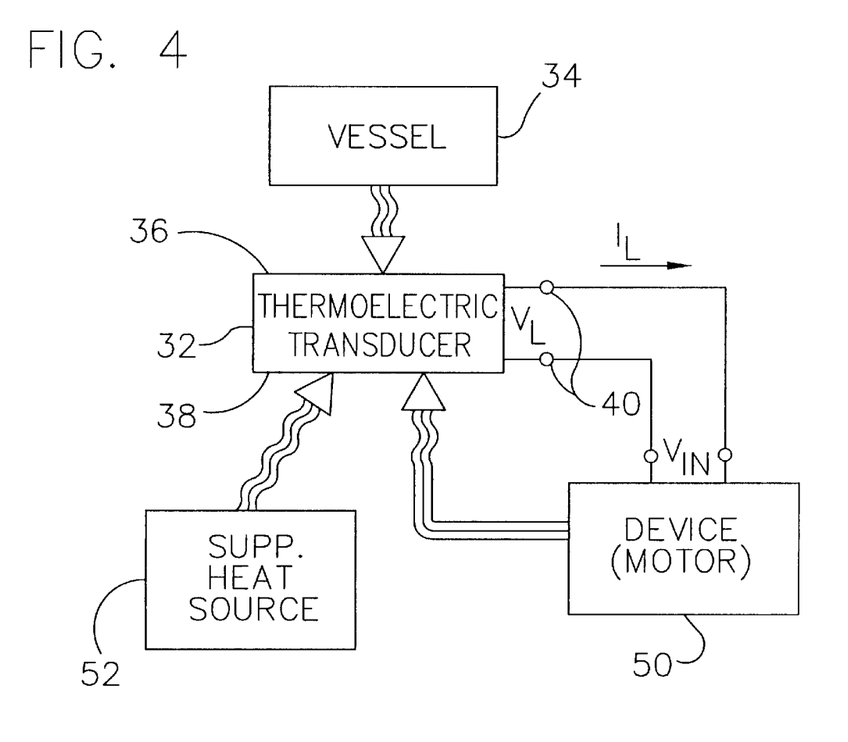
FIG. 4 is a block diagram of a cryogenic thermoelectric generator thermally connected in a feedback loop with an electrical device powered thereby.

A cryogenic thermoelectric system according to another preferred embodiment of the present invention is illustrated in FIG. 4. As shown therein, a device 50 is connected to and electrically powered by the transducer 32 via the output terminals 40. The device 50 is also thermally coupled to the hot side 38 of the transducer for transferring heat produced by the device 50 back to the transducer. As stated above, the cryogen is used to induce a temperature differential across the transducer, thus producing electric current for powering the device 50. As a result of the current $I_L$ passing therethrough, the device 50 produces heat that is directed back to the hot side 38 for maintaining or increasing the temperature differential across the transducer 32, thus producing additional electric current. In this manner, the transducer can be thermally coupled to the device 50 in a feedback system for producing electric power more efficiently. In one of the inventor's most preferred embodiments, the device 50 is an electric motor (for an electric vehicle) and a coolant (circulated via a pump, not shown) is used for transferring the heat produced by the electric motor to the hot side 38 of the transducer. A supplemental heat source 52 is also shown in FIG. 4 for providing heat to the hot side 38 during motor start-up when the motor is producing little if any heat, and/or at other times when the device 50 is not providing a sufficient amount of heat to the hot side.

Figure 5:
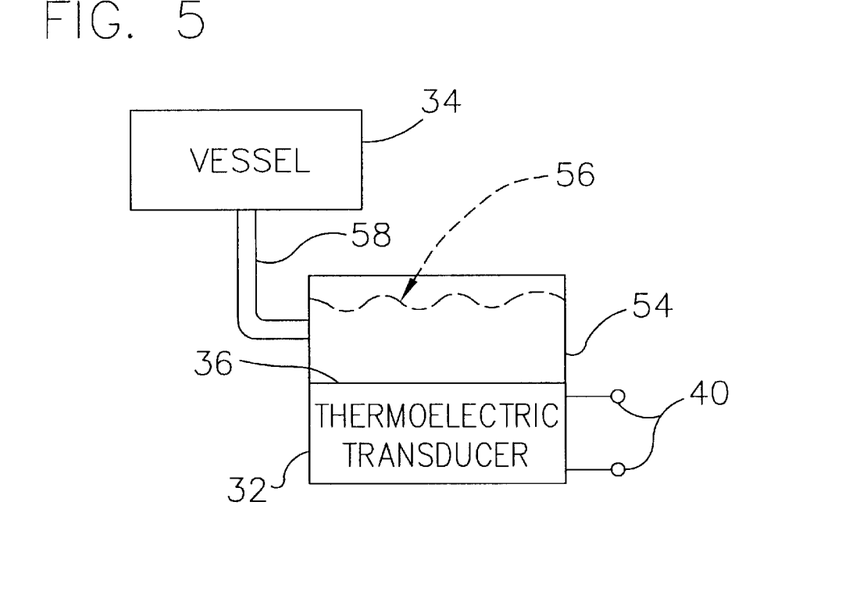
FIG. 5 is a block diagram of a cryogenic thermoelectric generator having a cryogen reservoir positioned on the cold side of the thermoelectric transducer.

The cryogen 42 can be thermally coupled to the cold side of the transducer (and the hot side as well) in a variety of manners. As an example, and as shown in FIG. 5, a reservoir 54 can be attached to the thermoelectric transducer 32 for containing a cryogen 56, such as liquid nitrogen. The reservoir 54 can be bottomless such that the cryogen 56 directly contacts the transducer's cold side, or the reservoir can include a bottom surface positioned between the cryogen 56 and the cold side 36. In the latter arrangement, the reservoir's bottom surface would constitute the intermediate medium described above. However, an additional intermediate medium can also be used and positioned between the reservoir's bottom surface and the transducer's cold side, if desired for a particular application of the invention. The reservoir 54 may comprise the vessel 34 described above with reference to FIGS. 1–4, or, for example, may comprise a separate chamber that is connected to the vessel 34 via a fill tube 58 for maintaining the cryogen 56 in the reservoir 54 at some specific level, as shown in FIG. 5. Where a substantially pure liquid such as liquid nitrogen is used as the cryogen 56, the reservoir 54 also comprises a vent (not shown) for allowing the cryogen to boil off.

Figure 6:
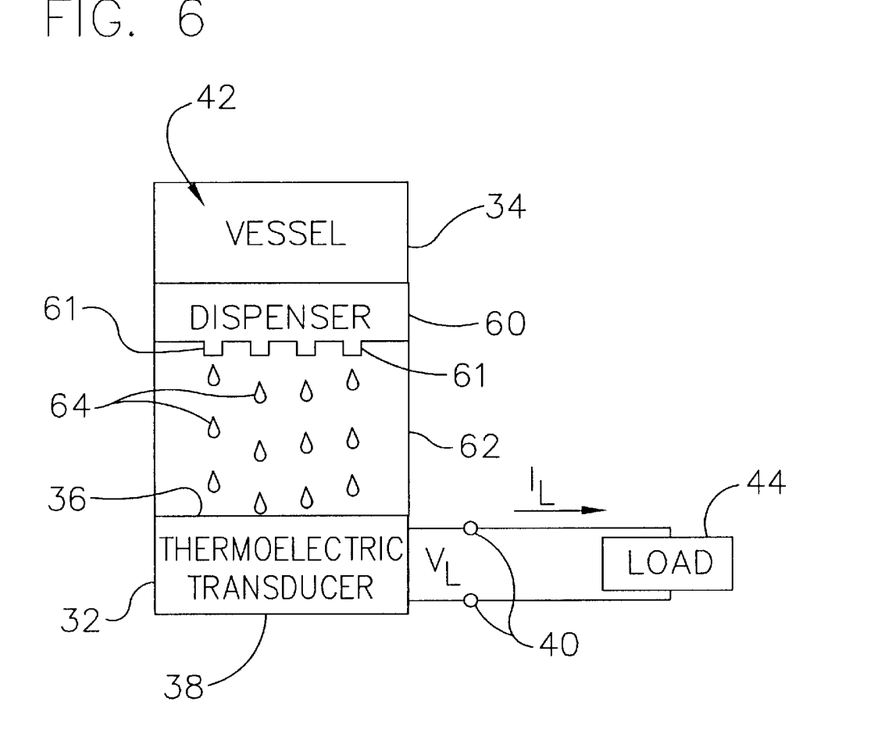
FIG. 6 is a block diagram of a cryogenic thermoelectric generator having a dispenser for controlling the amount of cryogen released to the thermoelectric transducer.

As another alternative, the cryogen can be provided to the thermoelectric transducer in the form of droplets, and the size of the droplets and/or the rate at which they impinge upon the transducer's cold side can be controlled to control the amount of "coldness" (i.e., negative thermal energy) delivered to the transducer. As shown in FIG. 6, for example, a dispenser 60 is attached to the vessel 34 for metering the cryogen 42 from the vessel in the form of droplets 64 that are released through a vented housing 62 directly onto the transducer's cold side 36. In this preferred embodiment, the dispenser 60 comprises several capillary tubes 61, and the size of the tubes and/or the pressure level of the cryogen can be controlled to control the size and/or delivery rate of the droplets. In this manner, the temperature differential across the thermoelectric transducer, and thus the electric current $I_L$ produced thereby, can likewise be controlled. Alternatively (or additionally), the current can be controlled by varying the impedance of the load circuit 44.

Figure 7:
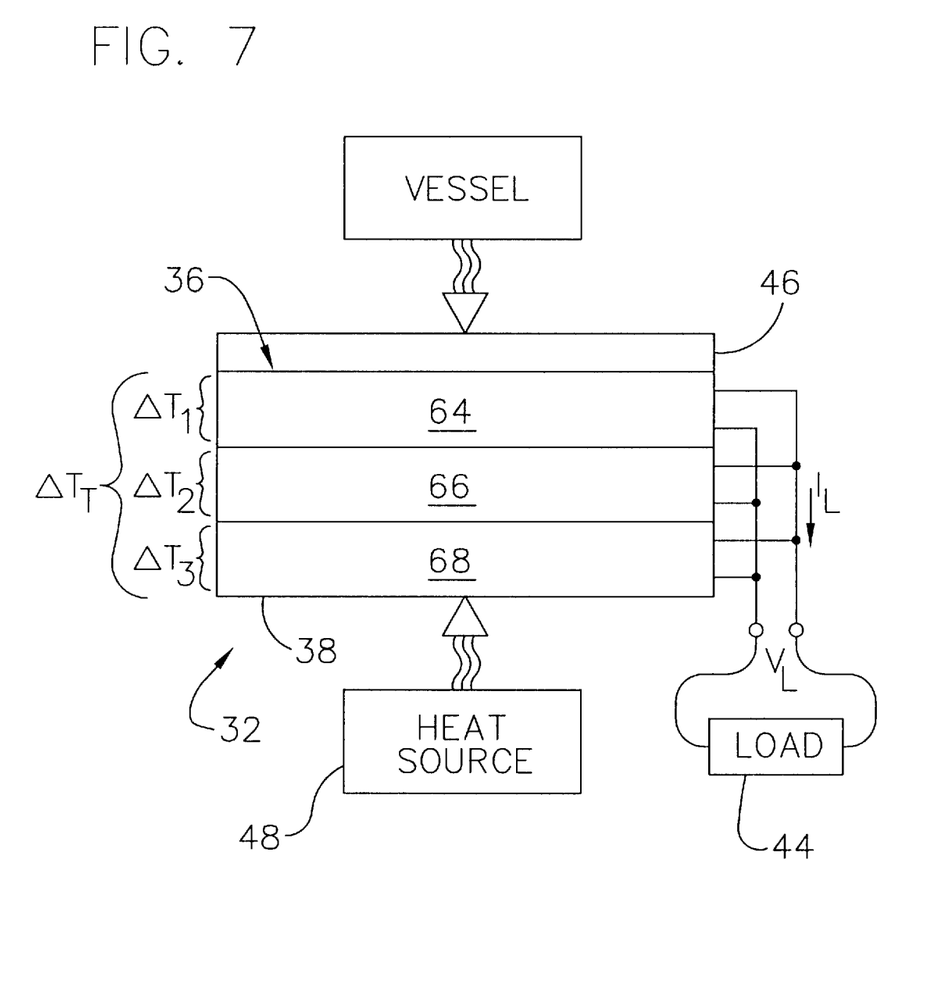
FIG. 7 is a block diagram of a generator having a thermoelectric transducer that is comprised of multiple thermoelectric modules electrically connected in parallel and thermally connected in series.

As mentioned above, the thermoelectric transducer may, itself, comprise a plurality of thermoelectric modules. For example, and as shown in FIG. 7, a preferred transducer 32 comprises three separate thermoelectric modules 64, 66, 68 that are thermally connected in series in a stacked arrangement. Thus, the total temperature differential $\Delta T_T$ across the hot and cold sides of the transducer 32 represents the sum of individual temperature differentials $\Delta T_1$, $\Delta T_2$ and $\Delta T_3$ across the individual modules. The outputs of the modules are electrically connected in parallel, thereby maximizing the amount of current $I_L$ delivered to the load 44. Electrically connecting the modules 64, 66, 68 in parallel also induces a generally even distribution of the temperature differential $\Delta T_T$ across the individual modules (i.e., $\Delta T_1 \approx \Delta T_2 \approx \Delta T_3$). As stated above, the inventor's most preferred cryogen is liquid nitrogen, which has a temperature of approximately $-196°$ C., and the thermoelectric modules of this preferred embodiment each have a maximum rated operating temperature of approximately 67° C. Thus, by thermally coupling liquid nitrogen to the transducer's cold side 36 when the hot side 38 has a temperature of approximately 0° C., a temperature differential of approximately 65° C. can be obtained across each thermoelectric module 64, 66, 68, which is roughly the same as the ideal operating temperature. However, where the same amount of electrical power can be produced using more than three thermoelectric modules, it is often preferable to do so given that the output impedance of four or more modules electrically connected in parallel will be less than the output impedance of three thermoelectric modules so connected.

During tests of the generator shown in FIG. 7, a short circuit current of 6.2 Adc and an open circuit voltage of 3.6 Vdc was obtained, thus demonstrating that the same levels of current and voltage can be produced for a load having an impedance substantially the same as the generator's output impedance.

Figure 8:
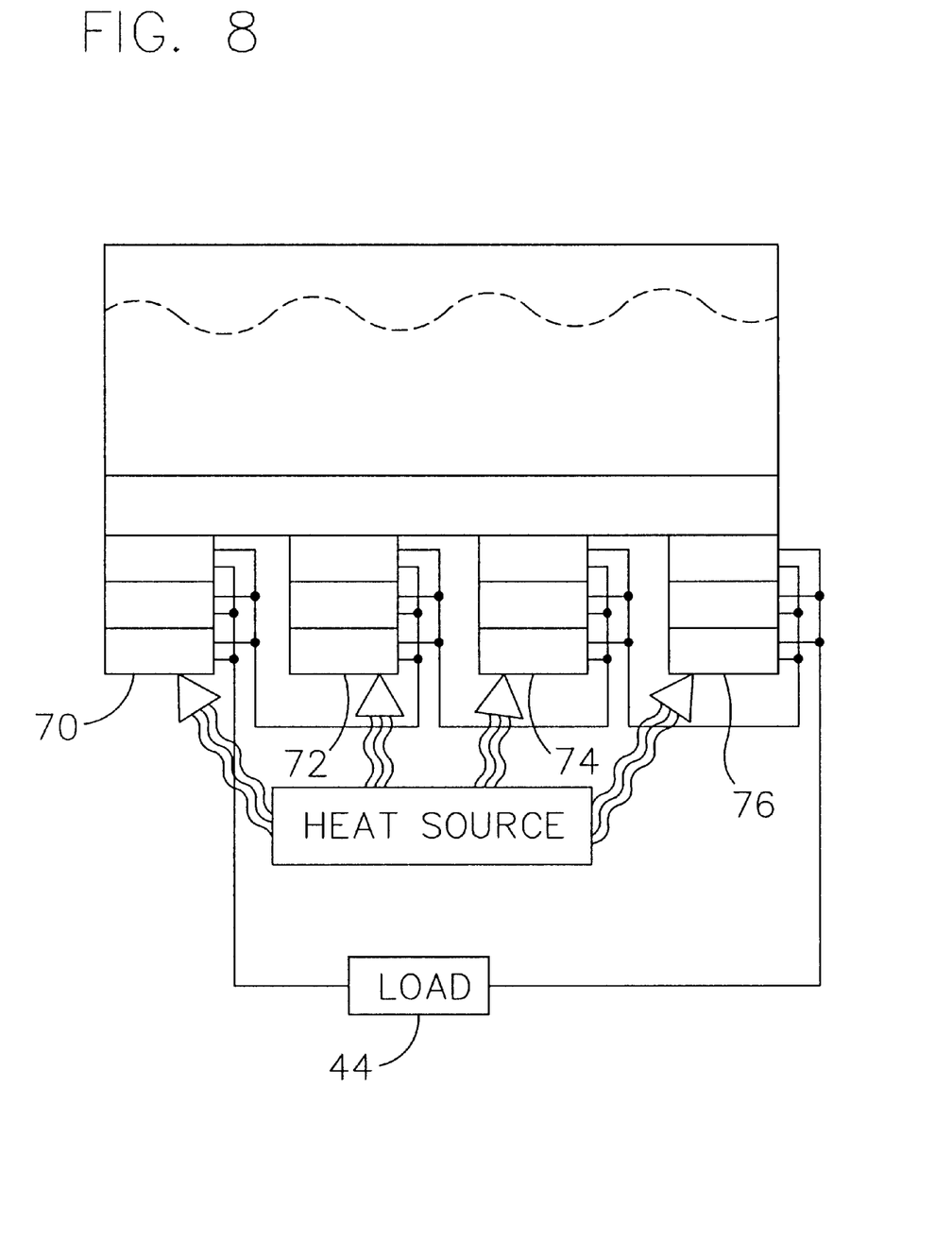
FIG. 8 is a block diagram of a generator having a plurality of thermoelectric transducers of the type shown in FIG. 7.

Another preferred embodiment of the invention is shown in FIG. 8, and comprises four separate thermoelectric transducers 70, 72, 74, 76, where each transducer comprises three separate thermoelectric modules arranged in the manner described above with reference to FIG. 7. The transducers 70, 72, 74 and 76 are electrically connected in series to sum their output voltages and thereby provide a maximum voltage to the load 44. However, it should be understood, as apparent to those skilled in art, that any number of thermoelectric transducers comprising any number of separate thermoelectric modules can be connected in a wide variety of series/parallel arrangements in order to produce a desired current and/or voltage for a given load, and/or to yield a generator having a desired output impedance. Indeed, the configurability of the present invention suggests that a cryogenic thermoelectric generator can be constructed for virtually any application. During tests of the specific generator shown in FIG. 8, where liquid nitrogen was used as the cryogen, an output voltage of approximately 5.5 Vdc and an output current of approximately 4.3 Adc was produced while the device was connected to a 6 volt, 50 watt tungsten lamp. Thus, the corresponding generator output impedance was approximately 1.3 ohms. This output impedance could be increased by adding impedance modules, or decreased by electrically connecting two or more of the thermoelectric transducers (or additional transducers) in parallel, as may be desired for a particular application.

In the tests performed on the cryogenic thermoelectric generators shown in FIGS. 7 and 8, the vessel was topless (and thus greatly vented) and contained liquid nitrogen. The intermediate medium, which was in direct contact with the liquid nitrogen via an opening in the bottom side of the vessel, was a heat sink (available through Wakefield Engineering of Wakefield, Mass. under part number 8260-40) of the type commonly used with microprocessors, and the thermoelectric modules were bismuth telluride Peltier coolers (although used as Seebeck generators) available from Marlow Industries of Dallas, Tex. under part number DT12-8-LS-01. The heat source comprised a metallic housing, in direct contact with the bottom thermoelectric module(s), through which an antifreeze coolant was circulated. The coolant was also circulated through an internal combustion engine, and had a temperature of approximately 120° F. The heat sink, thermoelectric modules, and metallic housing were connected together using 6:32 stainless steel screws (with a belville washer and a fiber washer under each screw head for purposes of thermal isolation and to accommodate thermal expansion and contraction while maintaining a substantially constant force) at a torque setting of approximately 8 inch pounds (thus creating a downward clamping force of approximately 60 pounds). Thermal grease having a high thermal conductivity was used on all contacting surfaces of the thermoelectric modules.

In a related application of the present invention, the cryogenic thermoelectric generator can be used as a temperature sensor for sensing the presence of cryogens, such as liquid nitrogen, in an environment.

There are various changes and modifications which may be made to the invention as will be apparent to those skilled in the art upon reading this disclosure. As an example, it is expected that special thermoelectric transducers and modules can be designed for optimum performance at extremely low temperatures, and that temperature differentials and more complex series/parallel circuit configurations other than those explicitly described herein can be advantageously utilized to implement the teachings of the present invention. However, these and all other changes and modifications are included in the teaching of the disclosure, and it is therefore intended that the invention be limited only by the scope of the claims appended hereto, and their equivalents. In addition, it should be understood that while, for practical purposes, only a limited set of claims are presented below, the inventor intends to secure claims (by way of additional related patents) to every aspect of the devices, systems and methods disclosed herein.

What is claimed is:

1. A device for generating electric power, the device comprising at least one thermoelectric transducer having a cold side and a hot side, and a heat source and a cold source both selectively thermally coupled to said hot side and to said cold side, said cold source selectively inducing a temperature differential between said cold and hot sides of the thermoelectric transducer when said hot side is at a temperature of at least ambient, the thermoelectric transducer producing electric power in response to the temperature differential.

2. The device of claim 1 wherein said cold source comprises a cryogen.

3. The device of claim 2 further comprising an intermediate medium thermally interfacing said cold source to said cold side.

4. The device of claim 2 wherein said cryogen is a substantially pure liquid.

5. The device of claim 4 wherein the substantially pure liquid is selected from the group consisting of liquid nitrogen, liquid oxygen, liquid argon, liquid hydrogen, liquid helium, liquid krupton and liquid methane.

6. The device of claim 1 wherein the heat source includes multiple controlled outputs for selectively providing heat to the hot side and the cold side of the thermoelectric transducer.

7. A device for generating electric power, the device comprising at least one thermoelectric transducer having a hot side and a cold side, a vessel containing a cryogen, the vessel being operatively connected to the thermoelectric transducer for thermally coupling the cryogen contained by the vessel to said cold side, and a dispenser operatively connected to said vessel for controlling the amount of cryogen thermally coupled to said cold side, whereby a temperature differential is induced across the hot and cold sides of the thermoelectric transducer and the thermoelectric transducer produces electric power in response to the induced temperature differential when the cryogen, is thermally coupled to said cold side and the hot side is at a temperature greater than zero degrees Celsius.

8. The device of claim 5 wherein the thermoelectric transducer is selected from the group consisting of semiconductor and superconductor devices.

9. The device of claim 6 wherein the thermoelectric transducer comprises a plurality of thermoelectric modules.

10. The device of claim 7 wherein the thermoelectric modules are thermally connected in series.

11. The device of claim 8 wherein the thermoelectric modules are electrically connected in parallel.

12. The device of claim 6 wherein said device comprises a plurality of thermoelectric transducers, each thermoelectric transducer comprises a plurality of thermoelectric modules, and the plurality of thermoelectric transducers are electrically connected to one another.

13. The device of claim 6 wherein the vessel is operatively connected to the thermoelectric transducer through an intermediate medium.

14. The device of claim 11 wherein said intermediate medium is selected from the group consisting of thermally conductive and semiconductive materials.

15. The device of claim 6 wherein said vessel is a Dewar vessel.

16. The device of claim 7 wherein the dispenser includes at least one capillary tube for selectively delivering said cryogen in droplet form to the cold side of said thermoelectric transducer.

17. The device of claim 16 further comprising a vented housing through which the cryogen is delivered in droplet form to the cold side of said thermoelectric transducer.

18. A system comprising at least one thermoelectric transducer having a hot side and a cold side, a cold source thermally coupled to the cold side of the thermoelectric transducer for inducing a temperature differential between said hot and cold sides, the thermoelectric transducer producing an electric current in response to said temperature differential, and an electrical device powered by said electric current, the hot side of the thermoelectric transducer being thermally coupled to heat produced by said electrical device.

19. The system of claim 14 wherein the cold source comprises a cryogen.

20. The system of claim 15 wherein the thermoelectric transducer is silicon-based.

21. The system of claim 16 wherein the electrical device is an electric motor.

22. The system of claim 17 wherein the cryogen is selected from the group consisting of liquid nitrogen, liquid oxygen, liquid argon, liquid hydrogen, liquid helium, liquid krypton, liquid methane, and dry ice.

23. The system of claim 17 further comprising a heat source thermally coupled to the hot side of said thermoelectric transducer.

24. A method for producing electric power with a thermoelectric transducer having at least a hot side and a cold side, the method comprising the step of:

creating a temperature differential across said thermoelectric transducer by inducing a below-ambient temperature at the cold side of said thermoelectric transducer via a cold source comprising a cryogen, wherein at least some of said cryogen boils off into a gas;

burning said gas to produce heat; and providing said heat to the hot side of said thermoelectric device.

25. The method of claim 20 wherein the creating step includes thermally coupling a cold source to the cold side of said thermoelectric transducer.

26. The method of claim 21 wherein the thermoelectric transducer comprises a semiconductor device.

27. The method of claim 22 further comprising the step of selecting a cryogen having a temperature between approximately 0 and 200° K.

28. The method of claim 23 wherein the coupling step includes bringing the cryogen into direct contact with the cold side of said thermoelectric device.

29. The method of claim 24 wherein the coupling step further includes controlling the amount of cryogen brought into direct contact with the cold side of said thermoelectric device.

30. The method of claim 23 wherein the coupling step includes thermally coupling the cryogen to the cold side of said thermoelectric device through an intermediate medium.

31. The device of claim 24 wherein the burning step includes burning said gas to drive a motor.

32. The device of claim 31 wherein the motor is a hydrogen-burning motor and the cryogen is liquid hydrogen.

33. The device of claim 26 wherein the providing step includes thermally coupling said heat to the hot side of said thermoelectric transducer using a heat exchanger.

34. A device comprising:

at least one thermoelectric transducer having a hot side and a cold side;

a cryogen thermally coupled to the cold side of the thermoelectric transducer for inducing a temperature differential between the cold side and the hot side; and an electric motor energized with electric power produced by the thermoelectric transducer in response to the temperature differential.

35. The device of claim 34 wherein the hot side of the thermoelectric transducer is thermally coupled to heat produced by the electric motor.

36. The device of claim 35 further comprising a coolant for thermally coupling the hot side to said heat.

37. The device of claim 36 further comprising a pump for circulating the coolant.

38. The device of claim 34 wherein the cryogen is a substantially pure liquid.

39. The device of claim 38 wherein the substantially pure liquid is selected from the group consisting of liquid nitrogen, liquid oxygen, liquid argon, liquid hydrogen, liquid helium, liquid krypton and liquid methane.

40. The device of claim 34 wherein the thermoelectric transducer includes output terminals to which the electric motor is connected for energizing the electric motor.

41. A method of producing electric power using a thermoelectric transducer having a hot side, and a cold side, the method comprising the steps of:

dispensing a cryogen from a vessel;

coupling the thermal energy of the dispensed cryogen to the cold side of the thermoelectric transducer to induce a temperature differential between the cold side and the hot side of the thermoelectric transducer, the thermoelectric transducer producing electric power in response to the temperature differential; and controlling the amount of said thermal energy that is coupled to the cold side to thereby control the temperature differential and the amount of electric power produced by the thermoelectric transducer.

* * * * *